(12) United States Patent
Lu

(10) Patent No.: US 10,790,377 B2
(45) Date of Patent: Sep. 29, 2020

(54) MANUFACTURING METHOD OF POLYSILICON SEMICONDUCTOR LAYER, THIN FILM TRANSISTOR AND MANUFACTURING METHOD

(71) Applicant: Wuhan China Star Optoelectronics Semiconductor Display Technology Co., Ltd., Wuhan (CN)

(72) Inventor: Ming-jen Lu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 74 days.

(21) Appl. No.: 16/095,376

(22) PCT Filed: Aug. 3, 2018

(86) PCT No.: PCT/CN2018/098433
§ 371 (c)(1),
(2) Date: Oct. 22, 2018

(87) PCT Pub. No.: WO2020/000581
PCT Pub. Date: Jan. 2, 2020

(65) Prior Publication Data
US 2020/0006524 A1  Jan. 2, 2020

(30) Foreign Application Priority Data

Jun. 27, 2018 (CN) .......................... 2018 1 0677628

(51) Int. Cl.
*H01L 29/66* (2006.01)
*H01L 21/02* (2006.01)
*H01L 21/265* (2006.01)

(52) U.S. Cl.
CPC .. *H01L 29/66537* (2013.01); *H01L 21/02532* (2013.01); *H01L 21/02592* (2013.01); *H01L 21/02667* (2013.01); *H01L 21/26513* (2013.01); *H01L 29/66757* (2013.01); *H01L 29/66765* (2013.01)

(58) Field of Classification Search
CPC ......... H01L 29/66757; H01L 29/78621; H01L 21/2026
See application file for complete search history.

(56) References Cited

U.S. PATENT DOCUMENTS

| 6,033,973 | A * | 3/2000 | Takemura | ......... | H01J 37/32412 438/514 |
| 2002/0164846 | A1* | 11/2002 | Lin | ................... | H01L 21/82345 438/197 |
| 2003/0020118 | A1* | 1/2003 | Kajiwara | .......... | H01L 29/42384 257/347 |
| 2004/0207026 | A1* | 10/2004 | Lin | ................... | H01L 21/82345 257/392 |

(Continued)

*Primary Examiner* — Jaehwan Oh

(57) ABSTRACT

A method for manufacturing a polysilicon semiconductor layer, a thin film transistor, and a manufacturing method are provided. The method for manufacturing a polysilicon semiconductor layer includes the following steps. A predetermined gas is dissociated, and a low amount of first ions and a high amount of second ions are screened out. A heavily doped region is doped with the second ions. A lightly doped region is doped with the first ions. Annealing is further performed, so that a polysilicon semiconductor layer is formed from an amorphous silicon layer.

10 Claims, 3 Drawing Sheets

(56) References Cited

U.S. PATENT DOCUMENTS

| | | | |
|---|---|---|---|
| 2006/0046362 A1* | 3/2006 | Lin | H01L 21/82346 438/163 |
| 2007/0181830 A1* | 8/2007 | Horsky | H01L 21/26513 250/492.21 |
| 2007/0224740 A1* | 9/2007 | Fukuda | H01L 27/1288 438/149 |
| 2010/0200954 A1* | 8/2010 | Del Agua Borniquel | H01L 21/2236 257/607 |
| 2014/0273420 A1* | 9/2014 | Cheng | H01J 37/3171 438/514 |

* cited by examiner

MANUFACTURING METHOD OF POLYSILICON SEMICONDUCTOR LAYER, THIN FILM TRANSISTOR AND MANUFACTURING METHOD

RELATED APPLICATIONS

This application is a National Phase of PCT Patent Application No. PCT/CN2018/098433 having International filing date of Aug. 3, 2018, which claims the benefit of priority of Chinese Patent Application No. 201810677628.3 filed on Jun. 27, 2018. The contents of the above applications are all incorporated by reference as if fully set forth herein in their entirety.

FIELD AND BACKGROUND OF THE INVENTION

The present disclosure relates to the field of display manufacturing technologies, and more particularly to a method for manufacturing a polysilicon semiconductor layer, a thin film transistor, and a manufacturing method.

In response to a rise of hand-held smart mobile devices, performance and high-quality requirements for display panels have become higher and higher. In order to increase product reliability, current mainstream product process design, requiring channel implantation (Vth), is one of the main focuses. As an aperture ratio of a current display panel is getting larger and larger, and production of some internal devices is becoming more and more precise, how to adjust a manufacturing method more stably and minutely becomes more important.

Currently, a channel implantation (Vth) method uses $B^+$ ions to improve a Vth start voltage, for example, doping of a polysilicon layer in a thin film transistor. Since a lightly doped portion requires low ion doses, process control accuracy needs to be high. Also, since a heavily doped region requires high ion doses, high ion throughput is expected. However, the channel implantation method using $B^+$ has the following disadvantages: since amount of $B^+$ ions dissociated from the $BF_3$ gas is about 5 times larger than amount of $B^{2+}$ ions and is much higher than amount of $B^{3+}$ ions, in a production of more precise devices in a display panel, the channel implantation method using $B^+$ ions is difficult to achieve small amount and precise control when $B^+$ ion implantation, so that a current of the $B^+$ ion beam cannot be smaller and more stable, and the channel implantation cannot be controlled very accurately.

Accordingly, it is necessary to provide a method for manufacturing a polysilicon semiconductor layer to solve the technical problems in the prior art.

SUMMARY OF THE INVENTION

The present disclosure provides a method for manufacturing a polysilicon semiconductor layer, a thin film transistor, and a manufacturing method, which can implant ions into corresponding doping regions by a fast and accurate channel implantation method, thereby reducing product defect rate and reducing production cost.

In order to solve technical problems described above, the technical solution provided by the present disclosure is as follows.

The present disclosure provides a method for manufacturing a polysilicon semiconductor layer. The method includes the following steps.

step S10, dissociating a predetermined gas containing ions for use in ion-implantation, and screening dissociated ions for implantation to obtain a low amount of first ions and a high amount of second ions;

step S11, doping a heavily doped region of an amorphous silicon layer with the second ions;

step S12, doping a lightly doped region of the amorphous silicon layer with the first ions; and step S13, annealing the amorphous silicon layer so that the polysilicon semiconductor layer is formed from the amorphous silicon layer doped with the first ions and the second ions.

According to one preferred embodiment of the present disclosure, the method includes the following steps.

step S101, dissociating a gas containing $BF_3$, and screening out $B^{2+}/B^{3+}$ ions and $B^+$ ions;

step S111, doping the heavily doped region of the amorphous silicon layer with $B^+$ ions;

step S121, doping the lightly doped region of the amorphous silicon layer with $B^{2+}/B^{3+}$ ions;

step S131, annealing the amorphous silicon layer so that the polysilicon semiconductor layer is formed from the amorphous silicon layer.

According to one preferred embodiment of the present disclosure, the step of doping the amorphous silicon layer includes bombarding a surface of the amorphous silicon layer with an ion beam containing the ions for use in ion-implantation.

According to one preferred embodiment of the present disclosure, the ion beam is obtained by generating an electron beam through a filament and bombarding an ion source with the electron beam to generate the ion beam containing the ions for use in ion-implantation.

According to one preferred embodiment of the present disclosure, before bombarding the surface of the amorphous silicon layer with the ion beam, ions of different masses in the ion beam are separated by a mass separator, thereby filtering out impurity ions.

The present disclosure also provides a method for manufacturing a thin film transistor. The method includes the following steps.

step S20, providing a substrate and forming an amorphous silicon layer on the substrate, dissociating a predetermined gas, and screening dissociated ions for implantation to obtain a low amount of first ions and a high amount of second ions;

step S21, doping a heavily doped region of an amorphous silicon layer with the second ions;

step S22, doping a lightly doped region of the amorphous silicon layer with the first ions;

step S23, annealing the amorphous silicon layer so that a polysilicon semiconductor layer with a source contact area and a drain contact area is formed from the amorphous silicon layer;

step S24, forming a source and a drain at positions corresponding to the source contact area and the drain contact area, and electrically connecting the source and the drain with the source contact area and the drain contact area, respectively.

According to one preferred embodiment of the present disclosure, the first ions are $B^{2+}/B^{3+}$ ions and the second ions are $B^+$ ions.

According to one preferred embodiment of the present disclosure, the method includes the following steps.

step S25, forming a gate insulation layer on the polysilicon semiconductor layer; and step S26, forming a gate on the gate insulation layer corresponding to a predetermined position of the polysilicon semiconductor layer.

According to one preferred embodiment of the present disclosure, before forming an amorphous silicon layer on the substrate, further including:

step S201, forming a gate on the substrate and forming a gate insulation layer on the gate; and step S202, forming the amorphous silicon layer on the gate insulation layer.

The present disclosure also provides a thin film transistor manufactured by the above-described manufacturing method.

The present disclosure has advantages as follows: in the method for manufacturing a polysilicon semiconductor layer, a thin film transistor, and a manufacturing method of the present disclosure, an initial voltage of channel implantation is adjusted by using a low amount of $B^{2+}/B^{3+}$ ions, and a lightly doped region of a polysilicon layer is doped with $B^{2+}/B^{3+}$ ions. Since a current generated by an ion beam is smaller and more stable, it is easy to adjust and control. This solution can be used on LTPS, OLED TFT LCDs, and so on to form a fast and accurate channel implantation (Vth) method. It can avoid a more serious variation caused by excessive and uncontrollable ion current during channel implantation (Vth), thereby improving product quality, reducing product defect rate and production cost! There is no need to purchase additional IMP machines and to perform additional processes, and this solution can be implemented by existing machines.

BRIEF DESCRIPTION OF THE SEVERAL VIEWS OF THE DRAWINGS

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

DETAILED DESCRIPTION OF SPECIFIC EMBODIMENTS OF THE INVENTION

Figure 1:
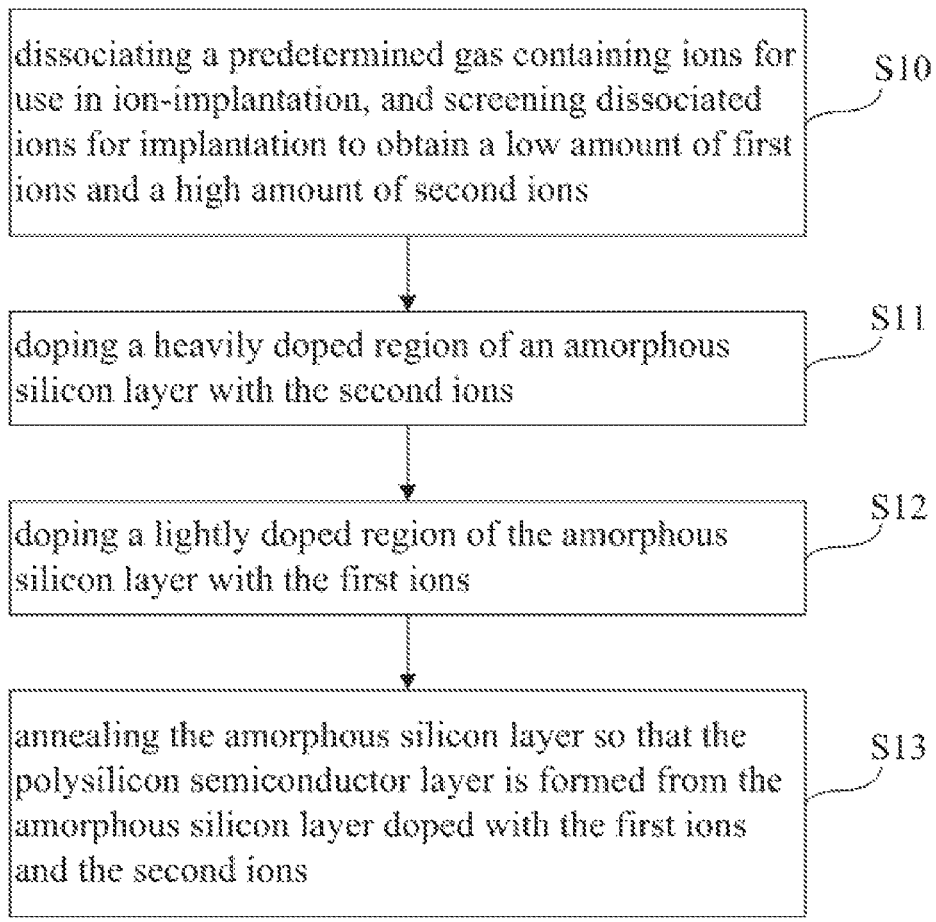
FIG. 1 is a flow chart of a method for manufacturing a polysilicon semiconductor layer according to an embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

In the prior art method for manufacturing a polysilicon semiconductor layer, since it is difficult to achieve small amount and precise control when $B^+$ ion implantation, so a channel implantation cannot be controlled very accurately. This embodiment of the present disclosure can solve the technical problem.

Referring to FIG. 1, which is a flow chart of a method for manufacturing a polysilicon semiconductor layer according to an embodiment of the present disclosure. The method includes the following steps.

Step S10, a predetermined gas containing ions for use in ion-implantation is dissociated, and dissociated ions for implantation are screened to obtain a low amount of first ions and a high amount of second ions.

The step S10 specifically includes the following step.

Step S101, a gas containing $BF_3$ is dissociated, and $B^{2+}/B^{3+}$ ions and $B^+$ ions are screened out.

The predetermined gas may be a $BF_3$ gas, a $BH_3$ gas, etc. which can be dissociated to generate $B^{2+}/B^+$ ions. This embodiment uses the $BH_3$ gas as an example. Ions are dissociated and screened out by using a channel implantation device. An electron beam is generated through a filament of the channel implantation device. An ion source is bombarded with the electron beam. The ion source includes one or more of the above gases to produce an ion beam containing ions for use in ion-implantation. The ion beam contains $B^+$, $B^{2+}$ or/and $B^{3+}$. The channel implantation device also includes a substrate platform for supporting a substrate to be doped (ion implanted). An amorphous silicon layer is formed on the substrate. Before bombarding a surface of the amorphous silicon layer with the ion beam, ions of different masses in the ion beam are separated by a mass separator which is located between the substrate platform and the ion source, thereby filtering out impurity ions, and reserving the ions for use in ion-implantation.

Step S11, a heavily doped region of an amorphous silicon layer is doped with the second ions.

The step S11 specifically includes the following step.

Step S111, the heavily doped region of the amorphous silicon layer is doped with $B^+$ ions.

The step of doping the amorphous silicon layer includes bombarding a surface of the amorphous silicon layer with an ion beam containing the ions for use in ion-implantation. Since the heavily doped region is implanted with relative high ion doses, the dose required for a process is generally about $1E15$ ions/cm$^2$, a high amount of ions is screened out for use in implantation to form the ion beam, where this region is doped with the ion beam. Since amount of $B^+$ ions dissociated from the $BF_3$ gas is about 5 times amount of $B^{2+}$ ions, and is also much higher than amount of $B^{3+}$ ions, a process time can be greatly shorten by doping with $B^+$ ions.

Step S12, a lightly doped region of the amorphous silicon layer is doped with the first ions.

The step S12 specifically includes the following step.

Step S121, the lightly doped region of the amorphous silicon layer is doped with $B^{2+}/B^{3+}$ ions. Since the lightly doped region of the amorphous silicon layer is implanted with relative low ion doses, the dose required for a process is generally about $1E12$ ions/cm$^2$, it requires high accuracy and easy control during bombardment with the ion beam. In the prior art, a high amount of $B^+$ ions is generally used for bombardment, and a conductivity of the thin film transistor is often affected by inaccurate control. Since the amount of $B^{2+}/B^{3+}$ ions in the dissociated ions for use in ion-implantation is low, a current of the ion beam formed by $B^{2+}/B^{3+}$ ions is smaller and more stable than a current of the ion beam formed by $B^+$ ions, so that it can be more easily controlled when bombarding the lightly doped region of the amorphous silicon layer, thereby accurately controlling the channel implantation and ensuring electrical properties of the thin film transistor. In this embodiment, the heavily doped region of the amorphous silicon layer is primarily ion-implanted, and in other embodiments, the lightly doped region of the amorphous silicon layer may be primarily ion-implanted according to an actual process.

Step S13, the amorphous silicon layer is annealed so that the polysilicon semiconductor layer is formed from the amorphous silicon layer doped with the first ions and the second ions.

The step S13 specifically includes the following step.

Step S131, the amorphous silicon layer is annealed so that the polysilicon semiconductor layer is formed from the amorphous silicon layer.

Figure 2:
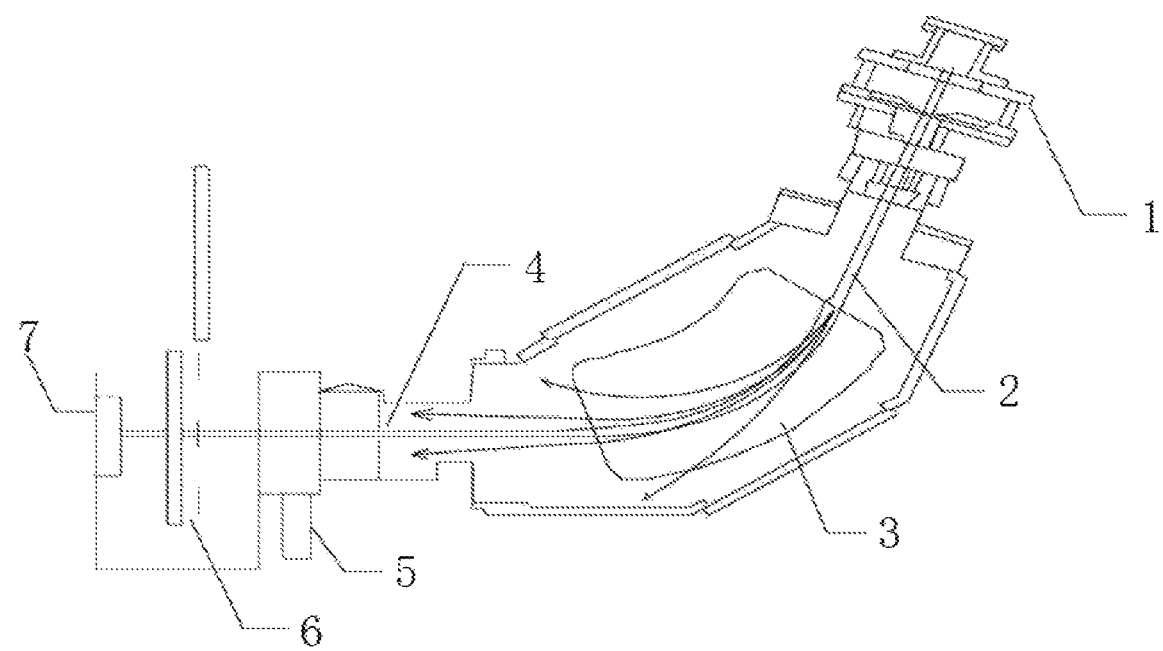
FIG. 2 is a structural diagram of a channel implantation device according to an embodiment of the present disclosure.

As shown in FIG. 2, which is a structural diagram of a channel implantation device according to an embodiment of the present disclosure. The device includes an ion source 1. The ion source 1 is used to generate an ion beam 2 after dissociation. The ion beam 2 contains implant ions and impurity ions required for the process. The ion beam 2 changes its path under an action of mass separation magnet 3, and ions of different masses have different paths, thereby separating ions of different masses to filter out most of the impurity ions. The separated ions are further filtered through slit 4, and the impurity ions are filtered out, thereby reserving the ions for use in ion-implantation (lightly doping process with $B^{2+}/B^{3+}$ ions, and heavily doping process with $B^+$ ions). The purity of the filtered ions for use in ion-implantation is increased, and a substrate 6 formed with a polysilicon layer is bombarded with the purified ion beam for ion implantation. Two substrates 6 are disposed on the channel implantation device and are allowed to move up and down. A measuring instrument 7 is used to measure the ion implantation on the substrate 6. The ion beam for implantation sequentially passes a plasma flood gun 5 (PFG) and a gap between two substrates 6, and then is incident on the measuring instrument 7. The ion beam for implantation is controlled in time by the result measured by the measuring instrument 7.

Figure 3:
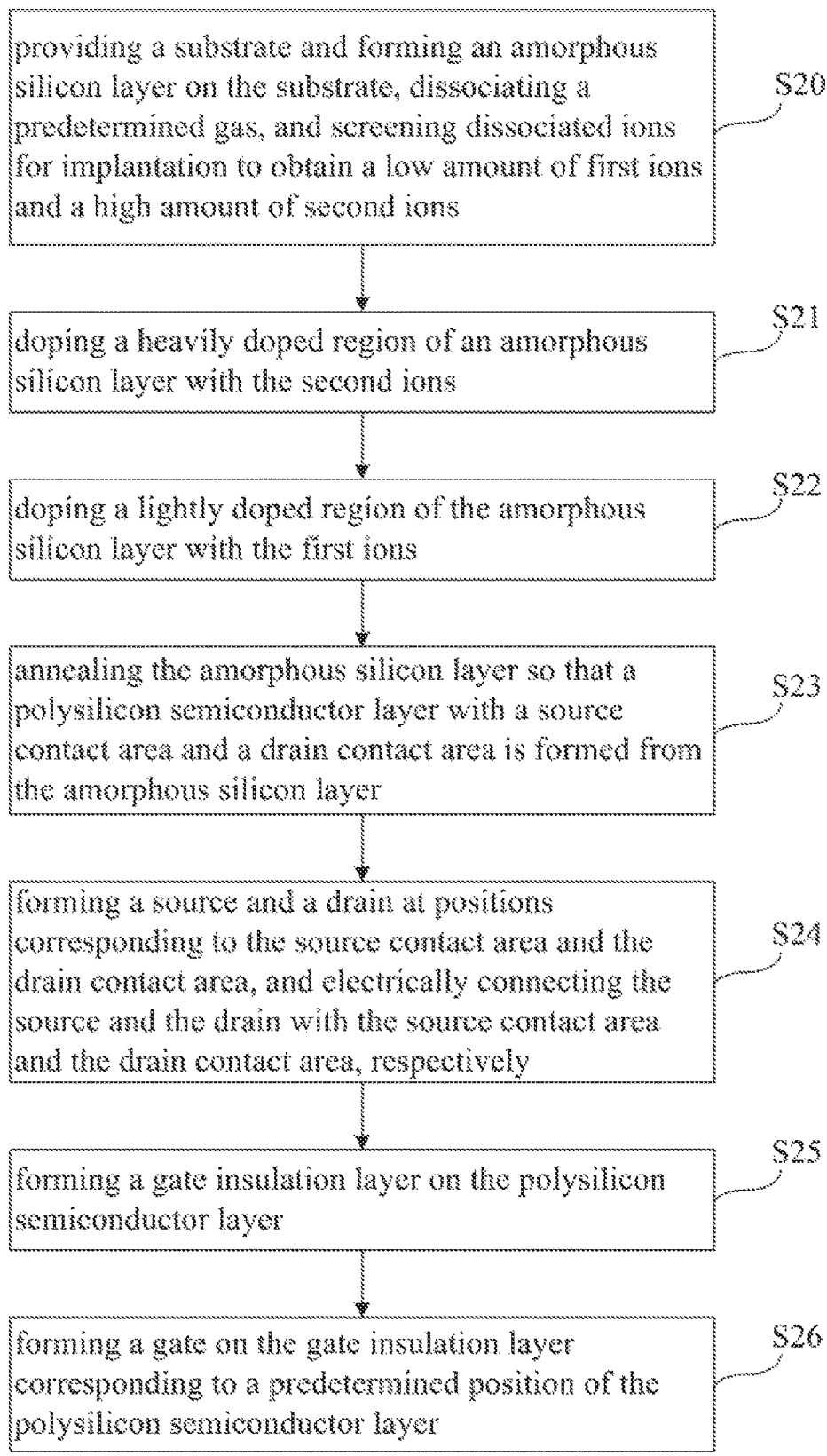
FIG. 3 is a flow chart of a method for manufacturing a thin film transistor according to an embodiment of the present disclosure.

As shown in FIG. 3, which is a flow chart of a method for manufacturing a thin film transistor according to an embodiment of the present disclosure. The method includes the following steps.

Step S20, a substrate is provided, and an amorphous silicon layer is formed on the substrate, and a predetermined gas is dissociated, and dissociated ions for implantation are screened to obtain a low amount of first ions and a high amount of second ions.

The predetermined gas is the same as the above examples, and is preferably $BF_3$ gas. The gas is dissociated by the channel implantation device, and a low amount of $B^{2+}/B^{3+}$ ions and a high amount of $B^+$ ions from ions are screened out.

Step S21, a heavily doped region of an amorphous silicon layer is doped with the second ions.

Step S22, a lightly doped region of the amorphous silicon layer is doped with the first ions.

Specifically, since in the ions dissociated for implantation amount of $B^+$ ions is higher than amount of $B^{2+}/B^{3+}$ ions, they can be used for ion implanting into the heavily doped region and the lightly doped region of the amorphous silicon layer, respectively. For the specific method, please refer to the description in the above embodiment.

Step S23, the amorphous silicon layer is annealed, so that a polysilicon semiconductor layer with a source contact area and a drain contact area is formed from the amorphous silicon layer.

Step S24, a source and a drain are formed at positions corresponding to the source contact area and the drain contact area, and the source and the drain are electrically connected with the source contact area and the drain contact area, respectively.

If the thin film transistor is a top gate structure, the following steps are performed after the step S24 is completed.

Step S25, a gate insulation layer is formed on the polysilicon semiconductor layer.

Step S26, a gate is formed on the gate insulation layer corresponding to a predetermined position of the polysilicon semiconductor layer.

The gate corresponds to a corresponding position in the amorphous silicon layer that is not doped. An interlayer dielectric layer is formed on the gate. A source contact hole and a drain contact hole through the interlayer dielectric layer and the gate insulation layer are formed on the source contact area and the drain contact area. Source and drain are respectively formed on the interlayer dielectric layer corresponding to positions of the source dielectric area and the drain contact area. The source and the drain are electrically connected to the source contact area and the drain contact area through the source contact hole and the drain contact hole, respectively.

If the thin film transistor is a bottom gate structure, before the formation of the amorphous silicon layer on the substrate, the method also includes the following steps.

Step S201, a gate is formed on the substrate and a gate insulation layer is formed on the gate.

Step S202, the amorphous silicon layer is formed on the gate insulation layer.

The present disclosure also provides a thin film transistor manufactured by the above-described manufacturing method.

The present disclosure also provides an array substrate manufactured by the above-described manufacturing method.

In the method for manufacturing a polysilicon semiconductor layer, a thin film transistor, and a manufacturing method of the present disclosure, an initial voltage of channel implantation is adjusted by using a low amount of $B^{2+}/B^{3+}$ ions, and a lightly doped region of a polysilicon layer is doped with $B^{2+}/B^+$ ions. Since a current generated by an ion beam is smaller and more stable, it is easy to adjust and control. This solution can be used on LTPS, OLED TFT LCDs, and so on to form a fast and accurate channel implantation (Vth) method. It can avoid a more serious variation caused by excessive and uncontrollable ion current during channel implantation (Vth), thereby improving product quality, reducing product defect rate and production cost! There is no need to purchase additional IMP machines and to perform additional processes, and this solution can be implemented by existing machines.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A method for manufacturing a polysilicon semiconductor layer, comprising:
   step S10, dissociating a predetermined gas containing ions for use in ion-implantation, and screening dissociated ions for implantation to obtain a low amount of first ions and a high amount of second ions, wherein the first ions and the second ions are a same element having different valences;
   step S11, doping a heavily doped region of an amorphous silicon layer with the second ions;
   step S12, doping a lightly doped region of the amorphous silicon layer with the first ions; and
   step S13, annealing the amorphous silicon layer so that the polysilicon semiconductor layer is formed from the amorphous silicon layer doped with the first ions and the second ions.

2. The manufacturing method as claimed in claim 1, further comprising:
   step S101, dissociating a gas containing BF3, and screening out B2+/B3+ions and B+ions;
   step S111, doping the heavily doped region of the amorphous silicon layer with B+ions;
   step S121, doping the lightly doped region of the amorphous silicon layer with B2+/B3+ions;
   step S131, annealing the amorphous silicon layer so that the polysilicon semiconductor layer is formed from the amorphous silicon layer.

3. The manufacturing method as claimed in claim 1, wherein the step of doping the amorphous silicon layer comprises bombarding a surface of the amorphous silicon layer with an ion beam containing the ions for use in ion-implantation.

4. The manufacturing method as claimed in claim 3, wherein the ion beam is obtained by generating an electron beam through a filament and bombarding an ion source with the electron beam to generate the ion beam containing the ions for use in ion-implantation.

5. The manufacturing method as claimed in claim 3, wherein before bombarding the surface of the amorphous silicon layer with the ion beam, ions of different masses in the ion beam are separated by a mass separator, thereby filtering out impurity ions.

6. A method for manufacturing a thin film transistor, comprising:
   step S20, providing a substrate and forming an amorphous silicon layer on the substrate, dissociating a predetermined gas, and screening dissociated ions for implantation to obtain a low amount of first ions and a high amount of second ions wherein the first ions and the second ions are a same element having different valences;
   step S21, doping a heavily doped region of an amorphous silicon layer with the second ions;
   step S22, doping a lightly doped region of the amorphous silicon layer with the first ions;
   step S23, annealing the amorphous silicon layer so that a polysilicon semiconductor layer with a source contact area and a drain contact area is formed from the amorphous silicon layer;
   step S24, forming a source and a drain at positions corresponding to the source contact area and the drain contact area, and electrically connecting the source and the drain with the source contact area and the drain contact area, respectively.

7. The manufacturing method as claimed in claim 6, wherein the first ions are B2+/B3+ions and the second ions are B+ions.

8. The manufacturing method as claimed in claim 6, further comprising:
   step S25, forming a gate insulation layer on the polysilicon semiconductor layer; and
   step S26, forming a gate on the gate insulation layer corresponding to a predetermined position of the polysilicon semiconductor layer.

9. The manufacturing method as claimed in claim 6, before forming an amorphous silicon layer on the substrate, further comprising:
   step S201, forming a gate on the substrate and forming a gate insulation layer on the gate; and
   step S202, forming the amorphous silicon layer on the gate insulation layer.

10. A manufacturing method of a thin film transistor according to claim 6.

* * * * *